(12) United States Patent  
Dong et al.

(10) Patent No.: US 12,446,454 B2
(45) Date of Patent: Oct. 14, 2025

(54) DISPLAY SUBSTRATE AND DISPLAY PANEL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xiangdan Dong, Beijing (CN); Yu Wang, Beijing (CN); Rong Wang, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 875 days.

(21) Appl. No.: 17/761,638

(22) PCT Filed: Mar. 23, 2021

(86) PCT No.: PCT/CN2021/082429
§ 371 (c)(1),
(2) Date: Mar. 18, 2022

(87) PCT Pub. No.: WO2022/198448
PCT Pub. Date: Sep. 29, 2022

(65) Prior Publication Data
US 2023/0061339 A1   Mar. 2, 2023

(51) Int. Cl.
*H10K 77/10* (2023.01)
*B32B 3/02* (2006.01)
(Continued)

(52) U.S. Cl.
CPC ............... *H10K 77/10* (2023.02); *B32B 3/02* (2013.01); *G09F 9/301* (2013.01);
(Continued)

(58) Field of Classification Search
CPC ......... B32B 3/04; H04M 1/0268–0269; H10K 77/00; H10K 50/844
See application file for complete search history.

(56) References Cited

U.S. PATENT DOCUMENTS

2020/0379595 A1   12/2020   Kim
2020/0401185 A1   12/2020   Won

FOREIGN PATENT DOCUMENTS

CN   110992831 A   4/2020
CN   111627330 A   9/2020
(Continued)

*Primary Examiner* — Mariceli Santiago
(74) *Attorney, Agent, or Firm* — Chiwin Law LLC

(57) ABSTRACT

A display substrate and a display panel, the display substrate includes a display region and a peripheral region surrounding the display region, the peripheral region has a first linear edge portion extending in a first direction, a second linear edge portion extending in a second direction and a corner edge portion connecting the first linear edge portion and the second linear edge portion, the first direction and the second direction intersect to each other, and a minimum distance between at least a portion of the corner edge portion and an adjacent edge of the display region is smaller than a minimum distance between the first linear edge portion and/or the second linear edge portion and an adjacent edge of the display region, so as to form a concave portion in the corner edge portion towards the display region.

19 Claims, 9 Drawing Sheets

(51) Int. Cl.
 G09F 9/30 (2006.01)
 H10K 50/844 (2023.01)
 H10K 102/00 (2023.01)

(52) U.S. Cl.
 CPC ...... *B32B 2457/206* (2013.01); *H10K 50/844* (2023.02); *H10K 2102/311* (2023.02)

(56) References Cited

FOREIGN PATENT DOCUMENTS

| | | | |
|---|---|---|---|
| CN | 111627332 | A | 9/2020 |
| CN | 111627338 | A | 9/2020 |
| CN | 111799310 | A | 10/2020 |
| CN | 211654169 | U | 10/2020 |
| CN | 112018155 | A | 12/2020 |
| CN | 112038371 | A | 12/2020 |
| CN | 112116867 | A | 12/2020 |
| CN | 112181204 | A | 1/2021 |
| JP | 2014132319 | A * | 7/2014 |
| KR | 20170091287 | A | 8/2017 |
| WO | 2020079805 | A1 | 4/2020 |
| WO | 2020218704 | A1 | 10/2020 |

* cited by examiner

DISPLAY SUBSTRATE AND DISPLAY PANEL

TECHNICAL FIELD

At least one embodiments of the present disclosure relates to a display substrate and a display panel.

BACKGROUND

With the improvement of consumer's sensory demand for a display screen and the progress of manufacturing technology in display panel industry, a curved screen and a curved display have become one of the hottest technologies in display industry at present. For example, by forming a curved surface at a periphery of a display device such as the mobile phone, the tablet computer, and the like, the display range of the display device can be visually increased, for example, a full-screen display effect can be achieved, and the user's sensory experience can be improved.

SUMMARY

At least one embodiment of the present disclosure provides a display substrate, the display substrate comprises a display region and a peripheral region surrounding the display region, the peripheral region has a first linear edge portion extending in a first direction, a second linear edge portion extending in a second direction and a corner edge portion connecting the first linear edge portion and the second linear edge portion, the first direction and the second direction intersect to each other, and a minimum distance between at least a portion of the corner edge portion and an adjacent edge of the display region is smaller than a minimum distance between the first linear edge portion and/or the second linear edge portion and an adjacent edge of the display region, so as to form a concave portion towards the display region in the corner edge portion.

For example, in the display substrate provided by at least one embodiment of the present disclosure, the display substrate has a display side and a non-display side, the first linear edge portion and the second linear edge portion are provided to be bendable towards a direction of the non-display side.

For example, in the display substrate provided by at least one embodiment of the present disclosure, the corner edge portion comprises an arc edge portion.

For example, in the display substrate provided by at least one embodiment of the present disclosure, the concave portion comprises at least one groove at a position of the corner edge portion which is adjacent to the first linear edge portion and/or the second linear edge portion.

For example, in the display substrate provided by at least one embodiment of the present disclosure, the display substrate has a display side and a non-display side, the corner edge portion is provided to be bendable towards a direction of the non-display side.

For example, in the display substrate provided by at least one embodiment of the present disclosure, the minimum distance between the first linear edge portion and/or the second linear edge portion and the adjacent edge of the display region is 0.8 mm-1.5 mm, and at the at least one groove, the minimum distance between the corner edge portion and the adjacent edge of the display region is 0.4 mm-0.6 mm.

For example, in the display substrate provided by at least one embodiment of the present disclosure, the minimum distance between the first linear edge portion and the adjacent edge of the display region is greater than the minimum distance between the second linear edge portion and the adjacent edge of the display region.

For example, in the display substrate provided by at least one embodiment of the present disclosure, a shape of the at least one groove comprises a rectangle, a trapezoid or a triangle.

For example, in the display substrate provided by at least one embodiment of the present disclosure, the peripheral region comprises a scanning driving circuit, and the scanning driving circuit comprises a first portion and a second portion, the first portion is provided in the first linear edge portion, and the second portion is provided in the corner edge portion.

For example, in the display substrate provided by at least one embodiment of the present disclosure, the peripheral region further comprises a first barrier dam surrounding the display region, and the first barrier dam is conformal with the at least one groove at a position of the at least one groove.

For example, in the display substrate provided by at least one embodiment of the present disclosure, the peripheral region further comprises a first isolation column surrounding the at least one groove, and the first isolation column is provided at a side of the first barrier dam close to the display region.

For example, in the display substrate provided by at least one embodiment of the present disclosure, the peripheral region further comprises a second isolation column surrounding the at least one groove, and the second isolation column is provided at a side of the first barrier dam away from the display region.

For example, in the display substrate provided by at least one embodiment of the present disclosure, the concave portion comprises an indented region, and the indented region is formed by concaving an entirety of the corner edge portion towards a direction of the display region.

For example, in the display substrate provided by at least one embodiment of the present disclosure, the minimum distance between the first linear edge portion and/or the second linear edge portion and the adjacent edge of the display region is 0.8 mm-1.5 mm, a minimum distance between an entirety of the corner edge portion and the adjacent edge of the display region is 0.4 mm-0.6 mm.

For example, in the display substrate provided by at least one embodiment of the present disclosure, the peripheral region comprises a scanning driving circuit, the scanning driving circuit comprises a first portion and a second portion, the first portion is provided in the first linear edge portion, and the second portion is provided in the second linear edge portion.

For example, in the display substrate provided by at least one embodiment of the present disclosure, the first portion and the second portion are in signal connection with each other.

For example, in the display substrate provided by at least one embodiment of the present disclosure, the peripheral region further comprises a first barrier dam surrounding the display region, and the first barrier dam is conformal with an edge of the indented region.

For example, in the display substrate provided by at least one embodiment of the present disclosure, the peripheral region further comprises a first isolation column surrounding an edge of the indented region, and the first isolation column is provided at a side of the first barrier dam close to the display region.

For example, in the display substrate provided by at least one embodiment of the present disclosure, the peripheral region further comprises a second isolation column surrounding the edge of the indented region, and the second isolation column is provided at a side of the first barrier dam away from the display region.

At least one embodiment of the present disclosure provides a display panel, the display panel includes any display substrate as mentioned above and a cover plate, the cover plate covers the display substrate and is attached to the display region and the peripheral region.

BRIEF DESCRIPTION OF THE DRAWINGS

In order to clearly illustrate the technical solutions of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
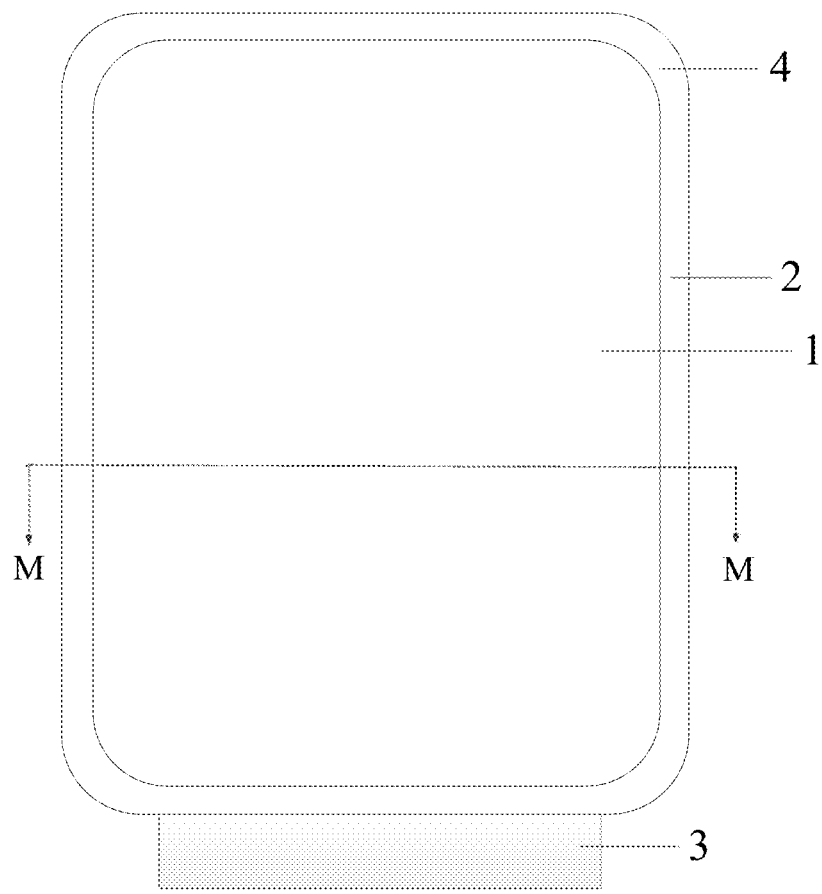
FIG. 1A is a schematic plan view of a display substrate.

FIG. 1A shows a schematic plan view of a display substrate. As shown in FIG. 1A, the display substrate has a display region 1, a peripheral region 2 surrounding the display region and a bending region 3 located at a side of the display region 1. The display region 1 includes a plurality of sub-pixels arranged in an array for displaying. The peripheral region has a driving circuit and the like to drive a plurality of sub-pixels in the display region 1 to display. The bending region 3 may be bent to a non-display side of the display substrate (that is, a side facing away from the paper surface in the figure). For example, a driving chip and the like may be provided at the non-display side for controlling the display region 1 to display. The bending region 3 has a plurality of traces to electrically connect the driving circuit in the display region 1 and the peripheral region 2 to the driving chip through the bent traces.

Figure 1B:
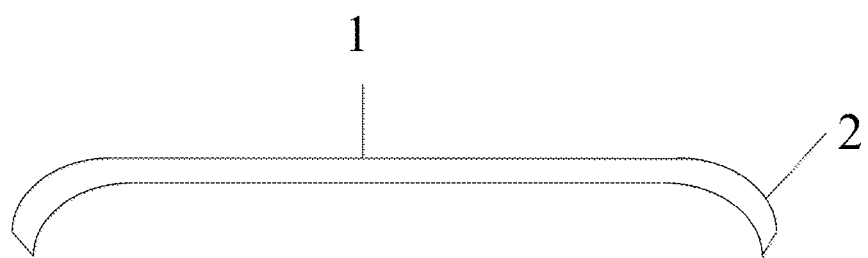
FIG. 1B is a schematic cross-sectional view of the display substrate in FIG. 1A along a MM line.

For example, FIG. 1B shows a schematic cross-sectional view of the display substrate in FIG. 1A along a MM line. As shown in FIG. 1B, the display substrate may realize the curved display around the display region 1 by bending the peripheral region 2 to the non-display side (a lower side shown in the figure) of the display substrate. For example, when the peripheral region 2 is bent, a corner portion 4 of the peripheral region 2 is prone to generate greater stress, and then the corner portion 4 is prone to generate a wrinkle and other defects. In addition, after the display substrate is manufactured, when the transparent cover plate is attached to the display substrate to form a display panel, because of the wrinkle in the corner parts 4, it is easy to cause problems that the transparent cover plate may not be completely attached to the display substrate or the transparent cover plate is easily peeled off from the display substrate, so that the display panel may have problems such as poor display, which seriously affects the manufacturing yield of the display panel.

At least one embodiment of the present disclosure provides a display substrate and a display panel. The display substrate includes a display region and a peripheral region surrounding the display region. The peripheral region has a first linear edge portion extending along a first direction, a second linear edge portion extending along a second direction and a corner edge portion connecting the first linear edge portion and the second linear edge portion; the first direction and the second direction intersect, and a minimum distance between at least a portion of the corner edge portion and an adjacent edge of the display region is smaller than a minimum distance between the first linear edge portion and/or the second linear edge portion and an adjacent edge of the display region, so as to form a concave portion towards the display region in the corner edge portion.

In the manufacturing process of the display substrate, the concave portion can reduce the stress exerted on the corner edge portion in a process of bending the peripheral region to the non-display side, thereby avoiding the problems of wrinkles and the like at the corner edge portion after bending the peripheral region, further facilitating the subsequent cover plate bonding process and improving the manufacturing yield of the display substrate and the display panel.

Next, the display substrate and display panel provided by the embodiment of the present disclosure will be introduced in detail through several specific examples.

Figure 2:
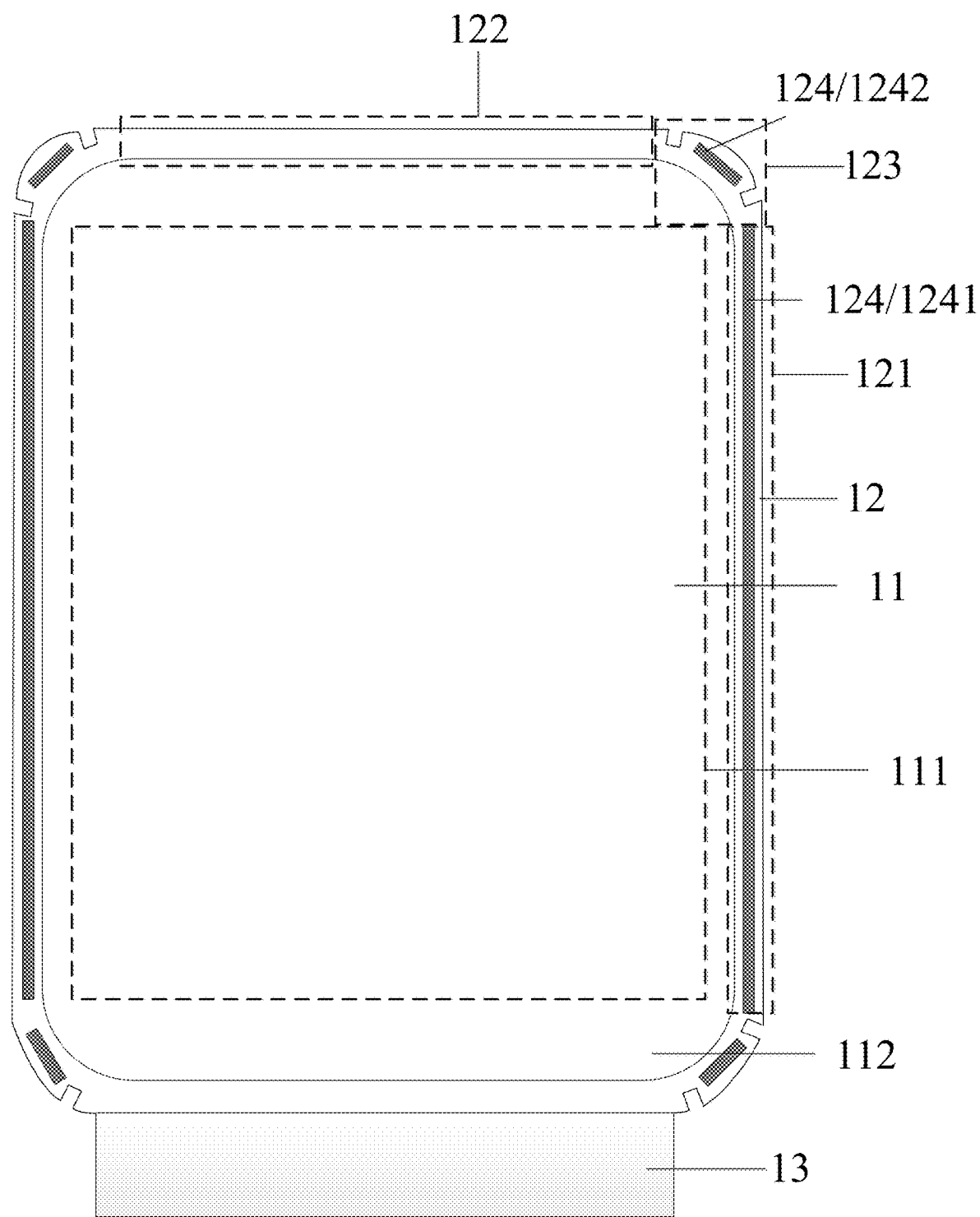
FIG. 2 is a schematic plan view of a display substrate provided by at least one embodiment of the present disclosure.

At least one embodiment of the present disclosure provides a display substrate, and FIG. 2 shows a schematic plan view of the display substrate. As shown in FIG. 2, the display substrate includes a display region 11 and a peripheral region 12 surrounding the display region 11.

For example, the peripheral region 12 has a first linear edge portion 121 extending in a first direction (such as a vertical direction in the figure), a second linear edge portion 122 extending in a second direction (such as a horizontal direction in the figure), and a corner edge portion 123 connecting the first linear edge portion 121 and the second linear edge portion 122. The first direction and the second direction intersect, for example, are perpendicular to each other.

Figure 3:
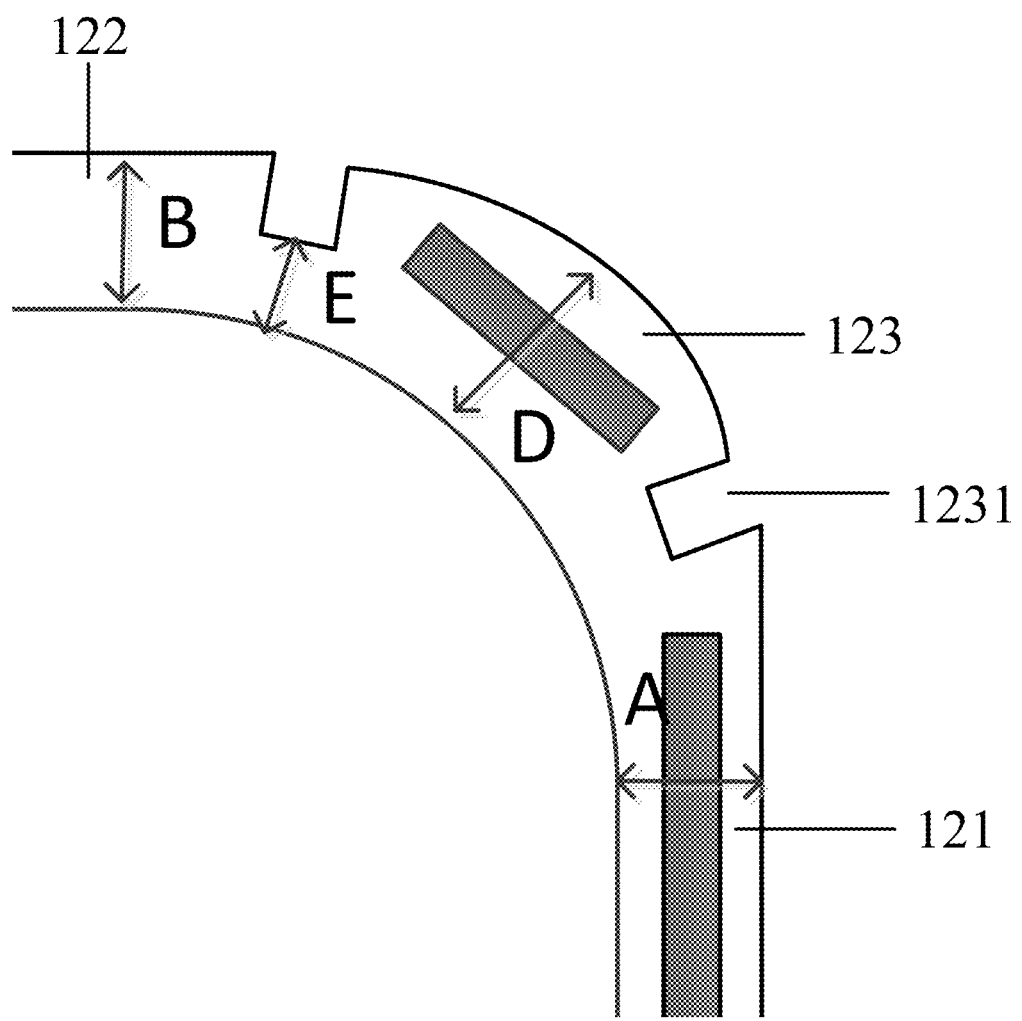
FIG. 3 is an enlarged schematic view of a corner edge portion of the display substrate in FIG. 2.

For example, FIG. 3 shows an enlarged schematic view of the display substrate in FIG. 2 at and near the corner edge portion 123. As shown in FIG. 3, the minimum distance E between at least portion of the corner edge portion 123 (for example, two grooves 1231 in the figure, which will be described in detail later) and an adjacent edge of the display region 11 is smaller than the minimum distance A between the first linear edge portion 121 and the adjacent edge of the display region 11, or, the minimum distance E between at least portion of the corner edge portion 123 and the adjacent edge of the display region 11 is smaller than the minimum distance B between the second linear edge portion 122 and the adjacent edge of the display region 11, or the minimum distance E between at least portion of the corner edge portion 123 and the adjacent edge of the display region 11 is smaller than the minimum distance A between the first linear edge portion 121 and the adjacent edge of the display region 11, and smaller than the minimum distance B between the second linear edge portion 122 and the adjacent edge of the display region 11, thereby forming a concave portion in the corner edge portion 123 towards the display region.

For example, in FIG. 2, the display substrate has two oppositely arranged first linear edge portions 121 and two oppositely arranged second linear edge portions 122, and every adjacent first linear edge portion 121 and second linear edge portion 122 are connected by one corner edge portion 123, so that the display substrate has four corner edge portions 123. For example, at least one corner edge portion 123 among the four corner edge portions 123 adopts the above-mentioned structure with the concave portion. For example, in some embodiments, each of the four corner edge portions 123 adopts the above-mentioned structure with the concave portion (the case shown in FIG. 2).

For example, the display substrate has a display side (that is, a side facing an user in a final product) and a non-display side, and the first linear edge portion 121 and the second linear edge portion 122 are arranged to be capable of bending towards a direction of the non-display side, so that a curved surface may be formed in the peripheral region 12. The specific form of the curved surface may refer to FIG. 1B.

For example, as shown in FIG. 2 and FIG. 3, the corner edge portion 123 includes an arc edge portion, thereby forming a rounded corner in the display substrate. For example, in other embodiments, the corner edge portion 123 may also include a right-angle edge portion, and the embodiment of the present disclosure does not limit the specific shape of the corner edge portion 123.

For example, in some embodiments, the concave portion includes at least one groove of the corner edge portion at an adjacent position adjacent to the first linear edge portion and/or the second linear edge portion. For example, in the example shown in FIG. 3, the concave portion includes two grooves 1231 at adjacent positions where the corner edge portion 123 is adjacent to the first linear edge portion 121 and the second linear edge portion 122, respectively. The grooves 1231 may reduce or avoid the stress generated in the corner edge portion 123 when the first linear edge portion 121 and the second linear edge portion 122 bend to the non-display side of the display substrate respectively, thus avoiding the wrinkles at a position of the corner edge portion 123 after the bending of the first linear edge portion 121 and the second linear edge portion 122.

For example, the corner edge portion 123 (for example, a portion between the two grooves 1231 in the corner edge portion 123) may also be set to be bent to a direction of the non-display side, so that the corner edge portion 123 may also form a curved surface, thereby realizing that the entire peripheral region 12 forms a curved surface.

For example, a shape of the groove 1231 may include the rectangular (as shown in the figure), the trapezoidal or the triangular shape, etc. For example, in practical implementation, the corner position of the rectangle, the trapezoid or the triangle may be realized as right angle or rounded corner. The disclosed embodiments are not particularly limited to this.

For example, as shown in FIG. 3, at the at least one groove 1231, the minimum distance E between the corner edge portion 123 and an adjacent edge of the display region 101 is smaller than the minimum distance A between the first linear edge portion 121 and the adjacent edge of the display region 11 and/or the minimum distance B between the second linear edge portion 122 and the adjacent edge of the display region 11, that is, the minimum distance E is smaller than the minimum distance A, or the minimum distance E is smaller than the minimum distance B, or the minimum distance E is smaller than the minimum distance A and the minimum distance B.

For example, in some embodiments, the minimum distance A between the first linear edge portion 121 and the adjacent edge of the display region 11 may be 0.8 mm-1.5 mm, such as 1.0 mm, etc. The minimum distance B between the second linear edge portion 122 and the adjacent edge of the display region 11 may be 0.8 mm-1.5 mm, such as 1.0 mm, etc. The minimum distance A and the minimum distance B may be the same or different. For example, at the at least one groove 1231, the minimum distance E between the corner edge portion 123 and the adjacent edge of the display region 101 is 0.4 mm to 0.6 mm, such as 0.5 mm, etc. At a position other than the groove 1231 of the corner edge portion 123, the minimum distance D between the corner edge portion 123 and the adjacent edge of the display region 101 is 0.8 mm to 1.5 mm, such as 1.0 mm, etc.

For example, corresponding to display substrates of different sizes and applied to different scenes, the minimum distance A, the minimum distance B, the minimum distance D and the minimum distance E mentioned above may also be selected according to the actual situation, which is not specifically limited by the embodiment of the present disclosure.

For example, in some embodiments, the minimum distance A between the first linear edge portion 121 and the adjacent edge of the display region 11 is greater than the minimum distance B between the second linear edge portion 122 and the adjacent edge of the display region 11, so that the first linear edge portion 121 can have sufficient space to set circuit pattern such as the scanning driving circuit.

For example, as shown in FIG. 2, the peripheral region 12 further includes a scanning driving circuit 124. The scanning driving circuit 124 includes a first portion 1241 and a second portion 1242, the first portion 1241 is provided in the first linear edge portion 121 and the second portion 1242 is provided in the corner edge portion 123. For example, the first portion 1241 and the second portion 1242 may be in signal connection with each other to jointly provide the driving signal for the display region 11.

For example, in some embodiments, the display region 11 of the display substrate includes a pixel array including a plurality of sub-pixels arranged in an array, and each of the plurality of sub-pixels includes a light-emitting member and a pixel driving circuit, the pixel driving circuit includes a row scanning signal terminal, a light-emitting control signal terminal and a data signal terminal for receiving the row scanning signal, the light emitting control signal and the data signal, respectively, and the pixel driving circuit is configured to operate according to the scanning signal, the light emitting control signal and the data signal.

For example, the scanning driving circuit 124 includes a row scanning driving circuit and a light-emitting scanning driving circuit. The row scanning driving circuit is configured to provide the row scanning signal. The light-emitting scanning driving circuit is configured to provide the light-emitting control signal. For example, the first portion 1041 of the scanning driving circuit 124 arranged in the first linear edge portion 121 may be configured to provide the row scanning signal and the light-emitting control signal to a plurality of rows of the sub-pixels in a middle portion 111 of the display region 11 (for example, a portion between two first linear edge portions 121 arranged oppositely). The second portion 1242 of the scanning driving circuit 124 provided in the corner edge portion 123 may be configured to provide the row scanning signal and the light-emitting control signal to a plurality of rows of the sub-pixels in a portion 112 near a corner of the display region 11 (for example, a portion at upper side and lower side of the middle portion 111). For example, in other embodiments, the first portion 1241 and the second portion 1242 of the scanning driving circuit 124 and the plurality of rows of sub-pixels in the display region 11 may be configured in other ways, which is not specifically limited by the embodiment of the present disclosure.

For example, in the first portion 1241 and the second portion 1242, the scanning driving circuit may respectively include a plurality of cascaded first shift register units, each of the first shift register units includes a first scanning signal output terminal, the plurality of first scanning signal output terminals correspond to a plurality of rows of sub-pixels in the display region 11, respectively, and the first scanning signal output terminals are correspondingly connected with the row scanning signal terminals of the sub-pixels through wires. Similarly, the light-emitting scanning driving circuit includes a plurality of cascaded second shift register units, each of the second shift register units includes a second scanning signal output terminal, the second scanning signal output terminals correspond to a plurality of rows of sub-pixels in the display region 11, and the second scanning signal output terminals are correspondingly connected with the light-emitting control signal terminals of the sub-pixels through wires. For example, the scanning driving circuits in the first portion 1241 and the second portion 1242 may be electrically connected to each other, so that the two portions may provide a plurality of cascaded first shift register units as a whole.

The embodiment of the present disclosure has no limitation on the specific structure of the scanning driving circuit 124. For example, a plurality of first shift register units included in the row scanning driving circuit or a plurality of second shift register units included in the light-emitting scanning driving circuit may have a 4T1C structure, that is, four transistors and one capacitor may be included to realize the functions of signal input, signal output, register reset, etc., or more transistors and/or capacitors may be added, for example, sub-circuits for realizing the functions of pull-up node control, pull-down node control, noise reduction, etc. may be added, to realize the inputting, outputting and resetting more stably.

Figure 4:
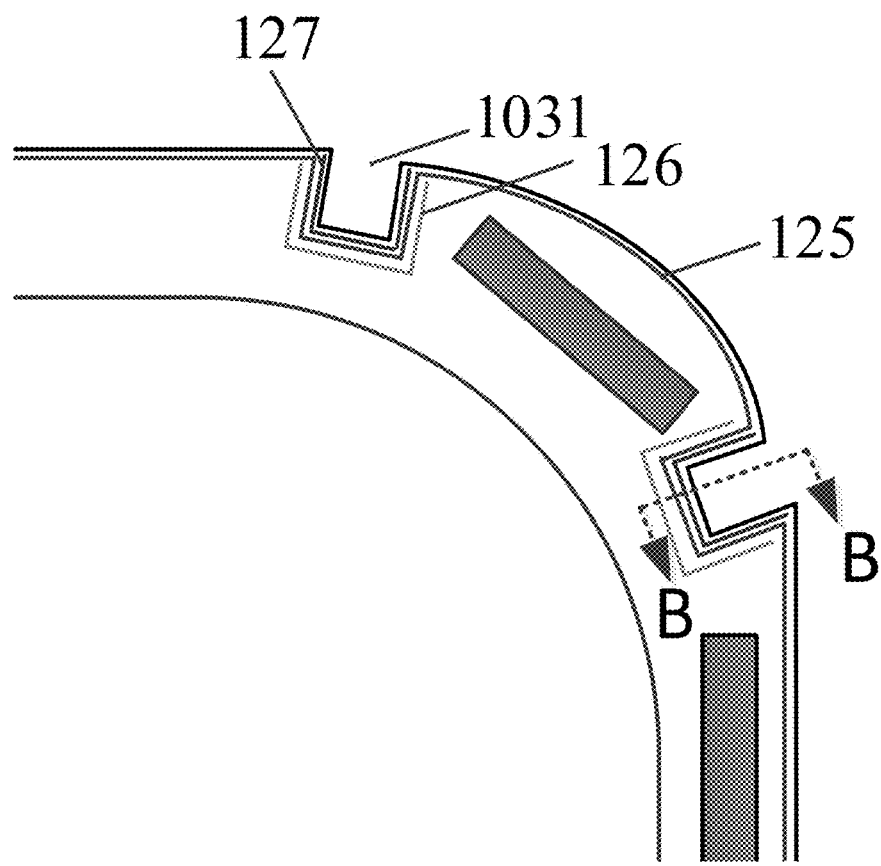
FIG. 4 is another enlarged schematic view of the corner edge portion of the display substrate in FIG. 2.

For example, FIG. 4 shows another enlarged schematic view of the display substrate in FIG. 2 at and near the corner edge portion. As shown in FIG. 4, the peripheral region 12 further includes a first barrier dam 125 surrounding the display region 11. For example, the first barrier dam 125 forms a closed pattern surrounding the display region 11 or a non-closed pattern with an opening in some regions. In the manufacturing process of the display substrate, the first barrier dam 125 may prevent some materials (such as an organic material, for example, an organic luminescent material, etc.) needed to form a certain structure in the display region 11 in the peripheral region 12 from overflowing and blocking an electrode (such as a cathode layer of the light-emitting member of the sub-pixel, which will be introduced later), thus forming an effective barrier effect. For example, the first barrier dam 125 is conformal with the at least one groove 1231 at a position of the at least one groove 1231, thus forming an effective barrier function at the position of the at least one groove 1231.

For example, in some embodiments, as shown in FIG. 4, the peripheral region 12 further includes a first isolation column 126 surrounding at least one groove 1231, and the first isolation column 126 is provided at a side of the first barrier dam 125 close to the display region 11. Because a width of the peripheral region 12 is relatively narrow at the position of at least one groove 1231, adding the first isolation column 126 surrounding at least one groove 1231 can further prevent some materials formed in the display region 11 from overflowing and blocking an electrode, so as to improve the reliability of the display substrate.

For example, in some embodiments, as shown in FIG. 4, the peripheral region 12 further includes a second isolation column 127 surrounding at least one groove 1231, and the second isolation column 127 is provided at a side of the first barrier dam 125 away from the display region 11. In the manufacturing process of the display substrate, because the groove 1231 needs to be formed in the corner edge portion 123, the groove 1231 may be formed by using punching, cutting or other manners, for example. When the groove 1231 is formed by using punching, cutting or other manners, a crack may appear around the groove 1231, and the second isolation column 127 can prevent the crack from being generated or extending to inside of the display substrate (such as the display region 11), thereby improving the manufacturing yield of the display substrate and ensuring the reliability of the display substrate.

Figure 5:
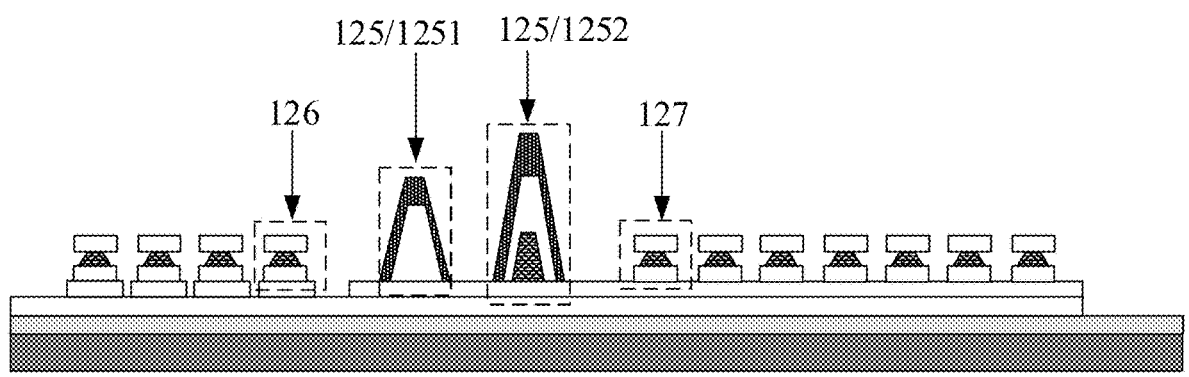
FIG. 5 is a schematic cross-sectional view of the display substrate in FIG. 4 along a line BB.

For example, FIG. 5 shows a schematic cross-sectional view of the display substrate in FIG. 4 along a line BB. As shown in FIG. 5, in some embodiments, the first isolation column 126 may include a multi-layer structure surrounding the groove 1231, and four layers are shown as an example in the figure. For example, the first barrier dam 125 may include a plurality of layers surrounding the display region 11, and two layers, namely a first layer 1251 and a second layer 1252, are shown as an example in the figure. For example, heights of the multi-layer barrier dams included in the first barrier dam 125 may be the same or different. For example, in the embodiment shown in FIG. 5, the second layer 1252 of the first barrier dam 125 is higher than the first layer 1251. For example, the second isolation column 127 may also include a plurality of layers surrounding the groove 1231, with seven layers shown as an example in the figure. The specific number of layers of the isolation column and the barrier dam may be selected according to requirements, which is not specifically limited by the embodiments of the present disclosure. In the embodiment of the present disclosure, the design of the multi-layer isolation column and the multi-layer barrier dam can further improve the barrier property, thereby improving the reliability of the display substrate.

Figure 6:
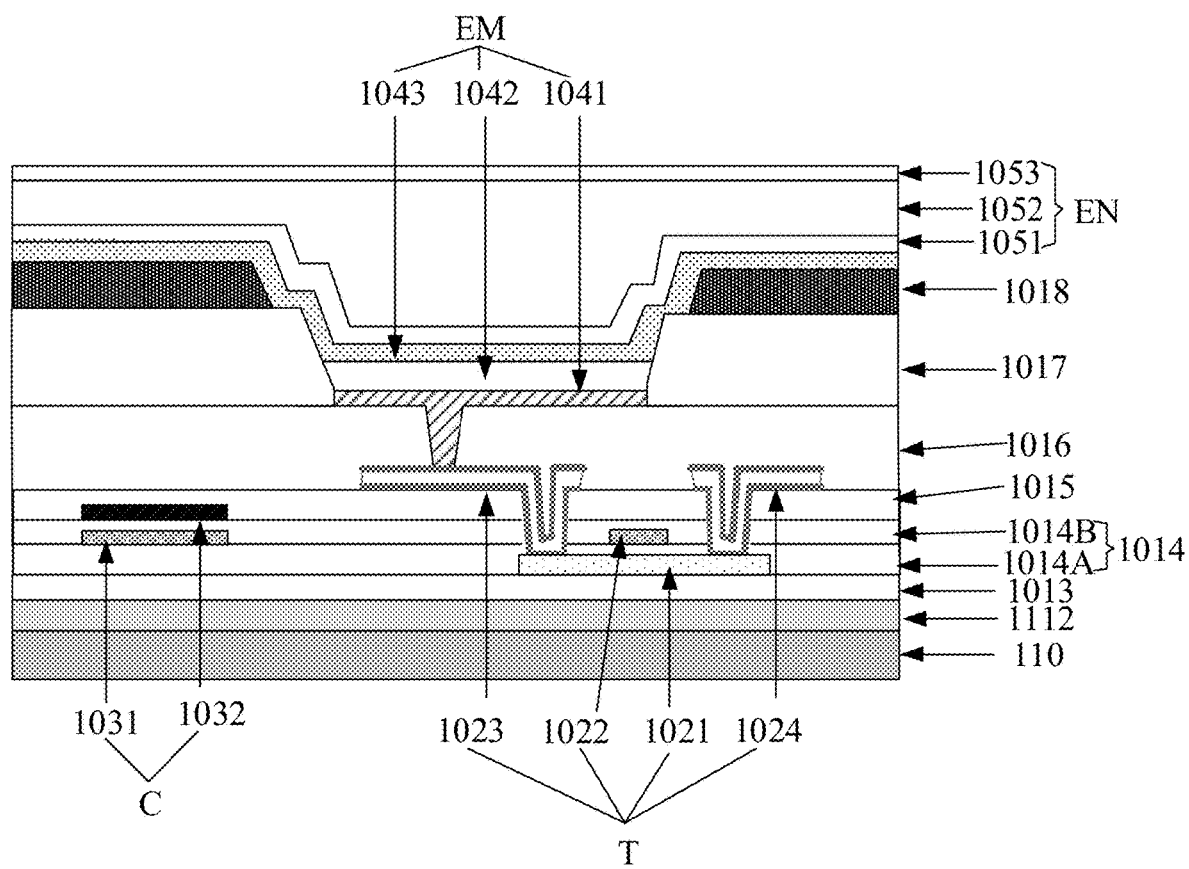
FIG. 6 is a schematic cross-sectional view of one sub-pixel in a display region of the display substrate in FIG. 4.

For example, FIG. 6 shows a schematic cross-sectional view of one sub-pixel in the display region 11. As shown in FIG. 6, each sub-pixel includes a light-emitting member EM and a pixel driving circuit. The pixel driving circuit is arranged on the base substrate 110, and includes a thin film transistor T and a storage capacitor C, etc. For example, the display region 11 further includes a planarization layer 1016 on a side of the pixel driving circuit away from the base substrate 110, and the light-emitting member EM is located on a side of the planarization layer 1016 away from the base substrate 110.

For example, as shown in FIG. 6, the thin film transistor T of the pixel driving circuit includes an active layer 1021, a gate electrode 1022, a gate insulating layer 1014 (for example, including a first gate insulating layer 1014A and a second gate insulating layer 1014B), an interlayer insulating layer 1015, and a source-drain electrode (including a source electrode 1023 and a drain electrode 1024), and these structures included in the thin film transistor T are sequentially arranged on the base substrate 110. The storage capacitor C of the pixel drive circuit includes a first capacitor plate 1031 and a second capacitor plate 1032. The light-emitting member EM includes an anode layer 1041, a light-emitting layer 1042 and a cathode layer 1043. The anode layer 1041 is connected to the source electrode 1023 of the thin film transistor through a through hole in the planarization layer 1016. For example, the first capacitor plate 1031 is arranged in the same layer as the gate electrode 1022, and the second capacitor plate 1032 is between the gate insulating layer 1014 and the interlayer insulating layer 1015.

For example, the source and drain of the thin film transistor T may use a metal material such as titanium, aluminum, copper or molybdenum or an alloy material. For example, the source and drain electrode may have a single-layer or multi-layer metal structure, such as a three-layer metal layer structure, such as titanium/aluminum/titanium, molybdenum/aluminum/molybdenum, titanium/copper/titanium or molybdenum/copper/molybdenum, etc. For example, the first isolation column 126 and the second isolation column 127 may be arranged in the same layer as the source and drain electrode, so as to have the same three-layer structure as the source and drain electrode, such as titanium/aluminum/titanium, molybdenum/aluminum/ molybdenum, titanium/copper/titanium, molybdenum/copper/molybdenum or the other three-layer metal structures. For example, in the manufacturing process of the display substrate, a middle layer of the three-layer structure of the first isolation column 126 and the second isolation column 127 may be indented relative to the upper and lower two layers by etching or the like, as shown in FIG. 5, so as to achieve better truncation effect, such as truncating the cathode layer 1043 formed on the entire surface of the display substrate, as shown in FIG. 6.

It should be noted that in the embodiment of this disclosure, "be arranged in the same layer" means that two functional layers or structural layers are in the same layer and formed of the same material in the hierarchical structure of the display substrate, that is, in the manufacturing process, the two functional layers or structural layers may be formed of the same material layer, and the required patterns and structures may be formed by the same patterning process.

For example, in some embodiments, as shown in FIG. 6, the display region 11 further includes a pixel definition layer 1017 (for defining a plurality of sub-pixels) located on a side of the planarization layer 1016 away from the pixel driving circuit, and a spacer layer 1018 located on a side of the pixel definition layer 1017 away from the planarization layer 1016. For example, the first barrier dam 125 is arranged in the same layer as at least a portion of the planarization layer 1016, the pixel definition layer 1017 and the spacer layer 1018. For example, the first layer 1251 of the first barrier dam 125 is arranged at the same layer as the planarization layer 1016, the pixel definition layer 1017 and the spacer layer 1018. For example, the second layer 1252 of the first barrier dam 125 is arranged in the same layer as any two layers of the planarization layer 1016, the pixel definition layer 1017 and the spacer layer 1018, thereby making the second layer 1252 of the first barrier dam 125 higher than the first layer 1251, and simplifying the manufacturing process of the display substrate.

For example, in some embodiments, as shown in FIG. 6, the display substrate may further include a barrier layer 1112 and a buffer layer 1013 arranged on the base substrate 110. The barrier layer 1012 may prevent impurities such as water and oxygen from penetrating into the functional structure such as the thin film transistor T from the base substrate 110. The buffer layer 1013 may provide a flat surface to facilitate the arrangement of other functional layers of the display substrate. The barrier layer 1112 and the buffer layer 1013 can jointly protect other functional structures on the base substrate 110.

For example, as shown in FIG. 6, the display substrate may further include an encapsulation layer EN, the encapsulation layer EN includes a first inorganic encapsulation layer 1051, a first organic encapsulation layer 1052 and a second inorganic encapsulation layer 1053 sequentially stacked on the base substrate 110. Therefore, the encapsulation layer EN can form a multi-layer encapsulation for the display substrate to protect the display substrate.

For example, in some embodiments, the base substrate 110 may be a flexible substrate such as polyimide (PI). For example, the materials of the gate electrode 1022, the first capacitor plate 1031 and the second capacitor plate 1032 include a metal material such as titanium, aluminum, copper or molybdenum or an alloy material. The active layer 1021 may be made of polysilicon, a metal oxide or the like. The barrier layer 1112, the buffer layer 1013, the gate insulating layer 1014 (including the first gate insulating layer 1014A and the second gate insulating layer 1014B), the interlayer insulating layer 1015, and the first inorganic packaging layer 1051 and the second inorganic packaging layer 1053 of the encapsulation layer EN may be made of inorganic insulating materials such as silicon oxide, silicon nitride or silicon oxynitride. For example, the planarization layer 1016, the organic insulating layer 101, the pixel definition layer 1017, the spacer layer 1018 and the first organic encapsulation layer 1052 of the encapsulation layer EN may be made of organic insulating materials such as polyimide or resin. The disclosed embodiment does not limit the material of each functional layer, and the material of each functional layer are not limited to the above examples.

For example, in some embodiments, as shown in FIG. 2, the display substrate may further include a bending region 13, a plurality of traces are arranged in the bending region 13 to connect the driving circuit in the display region 11 and the peripheral region 12 to the driving chip located on the non-display side of the display substrate by bending. The specific structure and arrangement manner of the bending region 13 may refer to the related technologies and will not be described again.

In the display substrate provided by the embodiment of the present disclosure, the concave portion is arranged at the corner edge portion of the display substrate, so that the stress exerted on the corner edge portion can be reduced in the process of bending the peripheral region, and then the problems such as generating wrinkles and the like at the corner edge portion after bending the peripheral region are avoided, thereby facilitating the subsequent cover plate bonding process and improving the preparation yield of the display substrate. In addition, by arranging the multi-layer isolation column and the multi-layer barrier dam at the periphery of the concave portion, the reliability of the display substrate at the concave portion can be improved, and the arrangement of the concave portion can be prevented from causing adverse effects on the display substrate, thereby improving the reliability of the display substrate.

Figure 7:
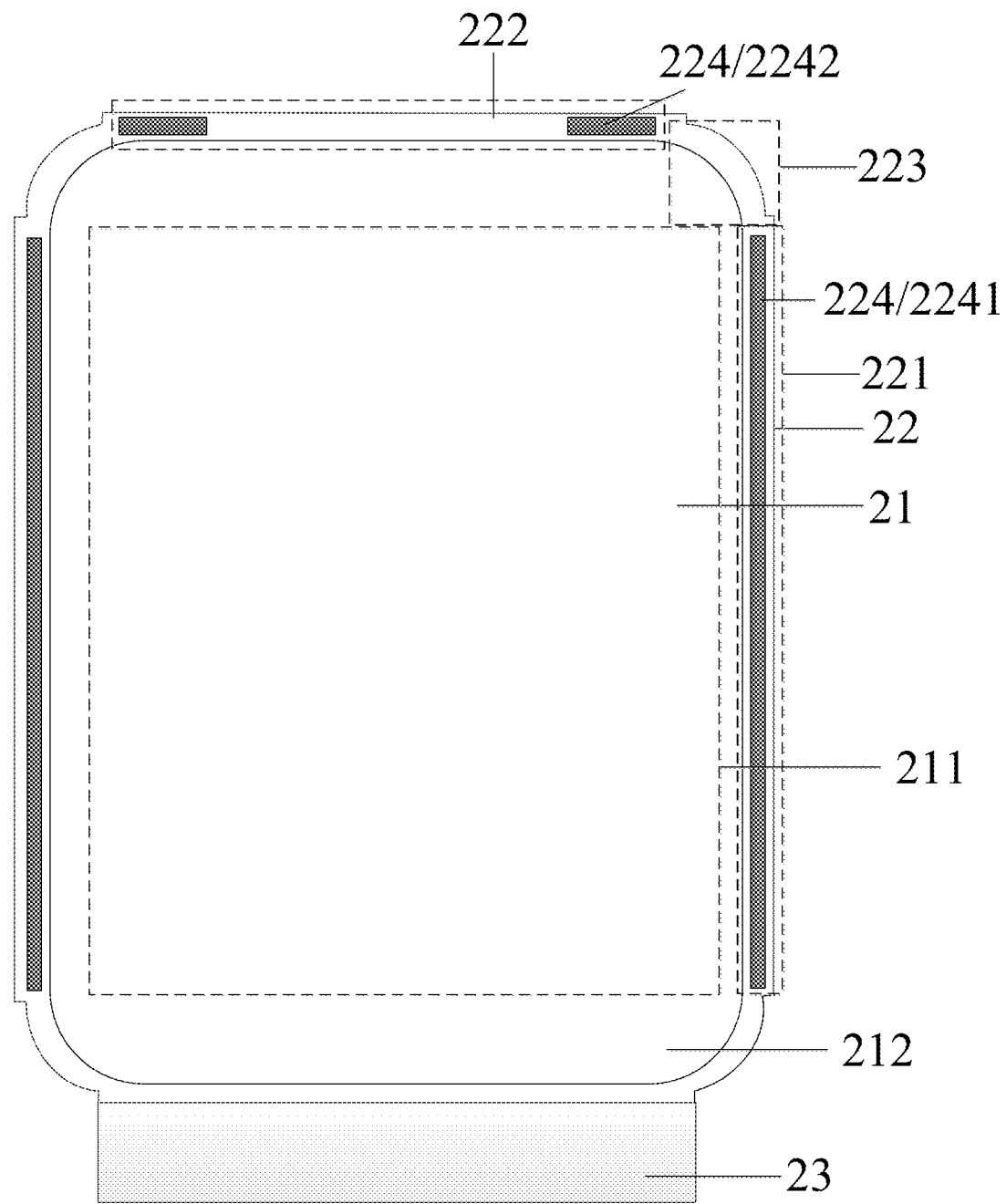
FIG. 7 is a schematic plan view of another display substrate provided by at least one embodiment of the present disclosure.

For example, FIG. 7 shows a schematic plan view of a display substrate provided by another embodiment of the present disclosure. As shown in FIG. 7, the display substrate includes a display region 21 and a peripheral region 22 surrounding the display region 21.

The peripheral region 22 has a first linear edge portion 221 extending in a first direction (for example, a vertical direction in the figure), a second linear edge portion 222 extending in a second direction (for example, a horizontal direction in the figure), and a corner edge portion 223 connecting the first linear edge portion 221 and the second linear edge portion 222. The first direction and the second direction intersect, for example, are perpendicular to each other.

Figure 8:
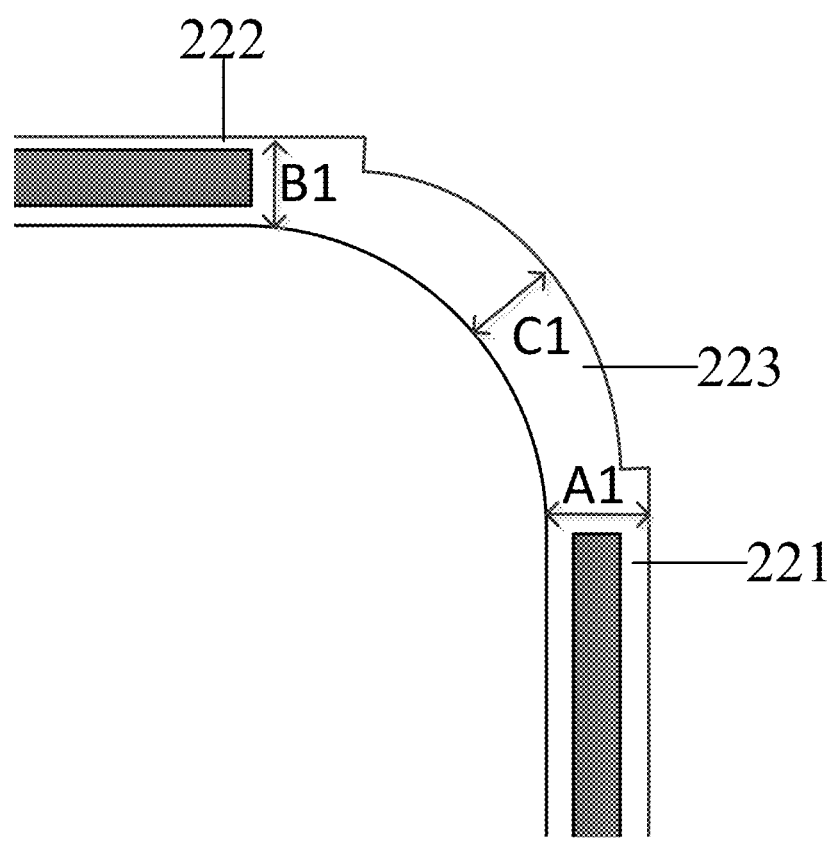
FIG. 8 is an enlarged schematic view of a corner edge portion of the display substrate in FIG. 7.

FIG. 8 is an enlarged schematic view of the display substrate in FIG. 7 at and near the corner edge portion. As shown in FIG. 8, the minimum distance C1 between at least a portion of the corner edge portion 223 (for example, the whole corner edge portion) and an adjacent edge of the display region 11 is smaller than the minimum distance A1 between the first linear edge portion 221 and the adjacent edge of the display region 21, or the minimum distance C1 between at least a portion of the corner edge portion 223 and the adjacent edge of the display region 11 is smaller than the minimum distance B1 between the second linear edge portion 222 and the adjacent edge of the display region 21. Alternatively, the minimum distance C1 between at least a portion of the corner edge portion 223 and the adjacent edge of the display region 21 is smaller than the minimum distance A1 between the first linear edge portion and the adjacent edge of the display region 21, and smaller than the minimum distance B1 between the second linear edge portion and the adjacent edge of the display region 21, to form a concave portion toward the display region in the corner edge portion 223. In the embodiment shown in FIG. 7 and FIG. 8, the concave portion includes an indented region in which the corner edge portion as a whole is indented toward a direction of the display region.

For example, the display substrate in FIG. 7 has two oppositely arranged first linear edge portions 221 and two oppositely arranged second linear edge portions 222, and every adjacent first linear edge portion 221 and second linear edge portion 222 are connected by one corner edge portion 223, so that the display substrate has four corner edge portions 223. For example, at least one corner edge portion 223 of the four corner edge portions 223 adopts the above structure. Further, for example, each of the four corner edge portions 223 adopts the above structure (the case shown in FIG. 7).

For example, the display substrate has a display side and a non-display side, and the first linear edge portion 221 and the second linear edge portion 222 are arranged to be bendable toward the non-display side, so that a curved surface may be formed in the peripheral region 22. The specific form of the curved surface may refer to FIG. 1B.

The concave portion of the corner edge portion 223 can reduce or avoid the stress generated in the corner edge portion 223 during the bending of the first linear edge portion 221 and the second linear edge portion 222 to the non-display side of the display substrate, and further avoid the wrinkles and the like generating at a position of the corner edge portion 223 after the bending of the first linear edge portion 221 and the second linear edge portion 222.

For example, as shown in FIG. 7 and FIG. 8, the corner edge portion 223 includes an arc edge portion, thereby forming a rounded corner in the display substrate. For example, in other embodiments, the corner edge portion 223 may also include a right-angle edge portion, and the embodiment of the present disclosure does not limit the specific shape of the corner edge portion 223.

For example, in some embodiments, the minimum distance A1 between the first linear edge portion 221 and the adjacent edge of the display region 21 is 0.8 mm to 1.5 mm, such as 1.0 mm, etc. The minimum distance B1 between the second linear edge portion 222 and the adjacent edge of the display region 21 is 0.8 mm to 1.5 mm, such as 1.0 mm, etc. The minimum distance A1 and the minimum distance B1 may be the same or different. For example, the minimum distance between the corner edge portion 223 as a whole and the adjacent edge of the display region 21 is 0.4 mm to 0.6 mm, such as 0.5 mm, etc.

For example, corresponding to display substrates of different sizes and applied to different scenes, the minimum distance A1, the minimum distance B1, and the minimum distance C1 mentioned above may also be selected according to the actual situation, which is not specifically limited by the embodiment of the present disclosure.

For example, as shown in FIG. 7, the peripheral region 22 further includes a scanning driving circuit 224, which includes a first portion 2241 and a second portion 2242. The first portion 2241 is provided in the first linear edge portion 221 and the second portion 2242 is provided in the second linear edge portion 222. For example, the first portion 2241 and the second portion 2242 are in signal connection to each other to jointly provide the driving signal for the display region 11.

For example, in some embodiments, the display region 21 of the display substrate includes a pixel array including a plurality of sub-pixels arranged in an array, and each of the plurality of sub-pixels includes a light-emitting member and a pixel driving circuit. The pixel driving circuit includes a row scanning signal terminal, a light-emitting control signal terminal and a data signal terminal for receiving the row scanning signal, the light-emitting control signal and the data signal, respectively, and the pixel driving circuit is configured to operate according to the scanning signal, the light-emitting control signal and the data signal.

For example, the scanning driving circuit 224 includes a row scanning driving circuit and a light-emitting scanning driving circuit. The row scanning driving circuit is configured to provide the row scanning signal. The light-emitting scanning driving circuit is configured to provide the light-emitting control signal. For example, the first portion 2041 of the scanning driving circuit 224 arranged in the first linear edge portion 221 may be configured to provide the row scanning signal and the light-emitting control signal to a plurality of rows of the sub-pixels in a middle portion 211 of the display region 21 (for example, a portion between two first linear edge portions 221 arranged oppositely). The second portion 2242 of the scanning driving circuit 224 provided in the second linear edge portion 222 may be configured to provide the row scanning signal and the light-emitting control signal to a plurality of rows of the sub-pixels close to the second linear edge portion 222 (for example, portions at the upper and lower sides of the middle portion 211) of the display region 21. For example, in other embodiments, the first portion 2241 and the second portion 2242 of the scanning driving circuit 224 and the plurality of rows of sub-pixels in the display region 21 may be configured in other ways, which is not specifically limited by the embodiment of the present disclosure.

For example, in the first portion 2241 and the second portion 2242, the scanning driving circuit may include a plurality of cascaded first shift register units, each of the plurality of first shift register units includes a first scanning signal output terminal, the first scanning signal output terminals correspond to a plurality of rows of sub-pixels in the display region 21, respectively, and the first scanning signal output terminals are correspondingly connected with the row scanning signal terminals of the sub-pixels through wires. Similarly, the light-emitting scanning driving circuit includes a plurality of cascaded second shift register units, each of the plurality of second shift register units includes a second scanning signal output terminal, the second scanning signal output terminals correspond to a plurality of rows of sub-pixels in the display region 21 respectively, and the second scanning signal output terminals are correspondingly connected with the light-emitting control signal terminals of the sub-pixels through wires. For example, the scanning driving circuits in the first portion 2241 and the second portion 2242 may be electrically connected to each other, so that the two portions may provide a plurality of cascaded first shift register units as a whole.

The embodiment of the present disclosure has no limitation on the specific structure of the scanning driving circuit 224. Details thereof may refer to the above embodiment, which will not be repeated here.

Figure 9:
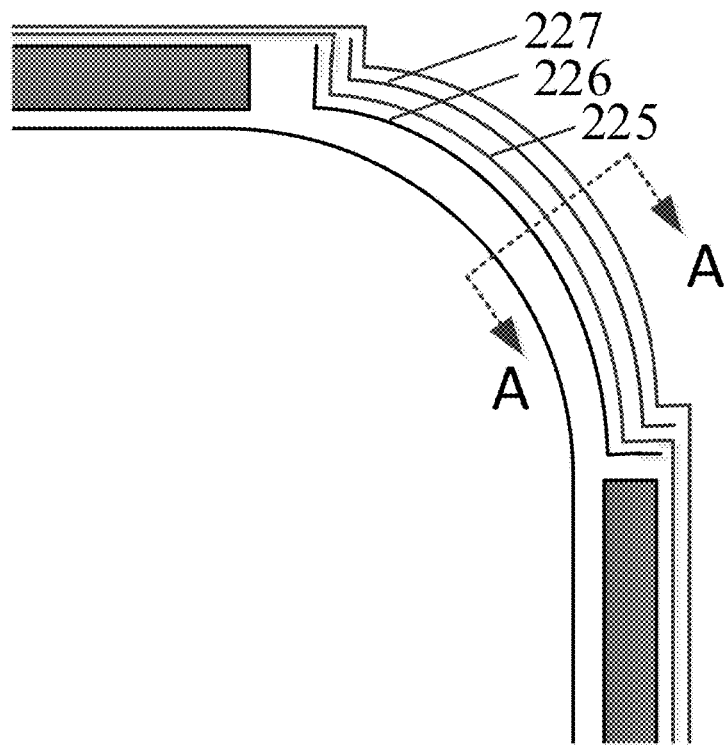
FIG. 9 is another enlarged schematic view of the corner edge portion of the display substrate in FIG. 7.

For example, FIG. 9 shows another enlarged schematic diagram of the display substrate in FIG. 7 at and near the corner edge portion. As shown in FIG. 9, the peripheral region 22 further includes a first barrier dam 225 surrounding the display region 21. For example, the first barrier dam 225 forms a closed pattern surrounding the display region 21 or a non-closed pattern with an opening in a portion of the region. In the manufacturing process of the display substrate, the first barrier dam 225 can block some materials (such as an organic material) formed in the display region 21 in the peripheral region 12 to overflow and block an electrode (such as cathodes of light emitting members of sub-pixels), thus forming an effective barrier effect. For example, the first barrier dam 225 is conformal with an edge of the indented region, thus forming an effective barrier at the indented region.

For example, in some embodiments, as shown in FIG. 9, the peripheral region 22 further includes a first isolation column 226 surrounding the edge of the indented region, and the first isolation column 226 is arranged at a side of the first barrier dam 225 close to the display region 21. Because a width of the peripheral region 12 is narrow at the indented region, adding the first isolation column 126 surrounding the indented region can further prevent some materials formed in the display region 11 from overflowing and blocking the electrode, so as to improve the reliability of the display substrate.

For example, in some embodiments, as shown in FIG. 9, the peripheral region further includes a second isolation column 227 surrounding the edge of the indented region, and the second isolation column 227 is arranged at a side of the first barrier dam 225 away from the display region 21. In the manufacturing process of the display substrate, because the corner edge portion 223 needs to form an indented region, the indented region may be formed by using punching, cutting or other manners, for example. When the indented region is formed by using punching, cutting or other manners, cracks may appear at a periphery of the indented region, and the second isolation column 227 can prevent the cracks from occurring or extending to the inside of the display substrate, thereby improving the manufacturing yield of the display substrate and ensuring the reliability of the display substrate.

Figure 10:
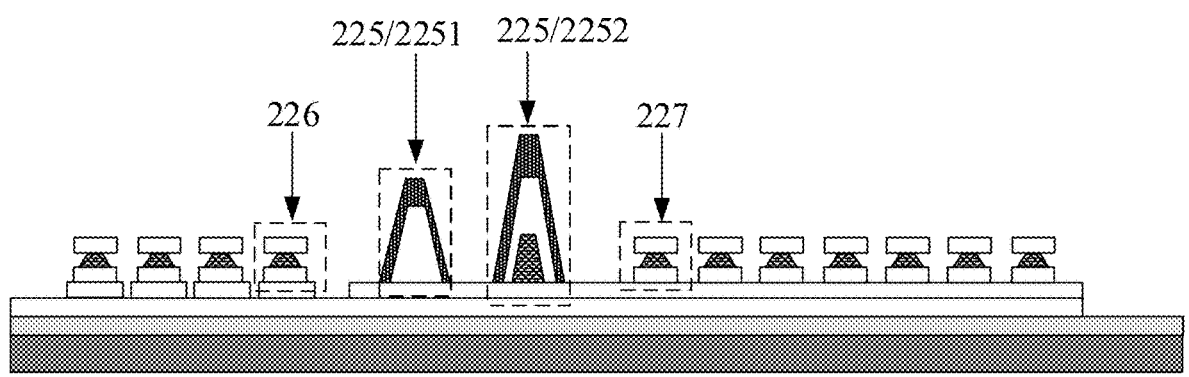
FIG. 10 is a schematic cross-sectional view of the display substrate in FIG. 9 along a line AA.

For example, FIG. 10 shows a schematic cross-sectional view of the display substrate in FIG. 9 along a line AA. As shown in FIG. 10, the first isolation column 226 may include a plurality of layers surrounding the indented region, and four layers are shown as an example in the figure. For example, the first barrier dam 225 may include a plurality of layers surrounding the display region 21, and two layers, namely the first layer 2251 and the second layer 2252, are shown as an example in the figure. For example, the heights of the multi-layer barrier dam included in the first barrier dam 225 may be the same or different. For example, in the embodiment shown in FIG. 10, the second layer 2252 of the first barrier dam 225 is higher than the first layer 2251. For example, the second isolation column 227 may include a plurality of layers surrounding the indented region, with seven layers shown as an example in the figure. The specific number of layers of isolation column and barrier dam may be determined according to actual requirements, which is not specifically limited by the embodiments of the present disclosure. According to the disclosed embodiment, the design of the multi-layer isolation column and the multi-layer barrier dam can further improve the barrier property, thereby improving the reliability of the display substrate.

For example, the display region 21 has a similar or identical structure to that of the display region 11 in the above embodiment. Referring to FIG. 6, each sub-pixel in the display region 21 includes a light-emitting member and a pixel driving circuit, and the pixel driving circuit includes a thin film transistor, a storage capacitor and other structures. For example, the thin film transistor includes an active layer, a gate electrode, a gate insulating layer (for example, including a first gate insulating layer and a second gate insulating layer), an interlayer insulating layer and a source-drain electrode (including a source electrode and a drain electrode), and these structures included in the thin film transistor T are sequentially arranged on the base substrate. The storage capacitor of the pixel driving circuit includes a first capacitor plate and a second capacitor plate. The light-emitting member includes an anode layer, a light emitting layer and a cathode layer.

For example, the source and drain of the thin film transistor may use a metal material such as titanium, aluminum, copper or molybdenum or an alloy material. For example, the source and drain electrode may have a single-layer or multi-layer metal structure, such as a three-layer metal layer structure, such as titanium/aluminum/titanium, molybdenum/aluminum/molybdenum, titanium/copper/titanium or molybdenum/copper/molybdenum, etc. For example, the first isolation column 226 and the second isolation column 227 may be arranged in the same layer as the source and drain electrode, so as to have the same three-layer structure as the source and drain electrode, such as titanium/aluminum/titanium, molybdenum/aluminum/molybdenum, titanium/copper/titanium or molybdenum/copper/molybdenum, etc. For example, in the manufacturing process of the display substrate, a middle layer of the three-layer structure of the first isolation column 226 and the second isolation column 227 may be indented relative to the upper and lower two layers by etching or the like, so as to realize better truncation, such as truncating the cathode layer formed on the whole surface.

For example, in some embodiments, referring to FIG. 6, the display region further includes a planarization layer, a pixel definition layer, a spacer layer and the like. For example, the first barrier dam 225 is arranged in the same layer as at least a portion of the planarization layer, the pixel definition layer and the spacer layer. For example, the first layer 2251 of the first barrier dam 225 is arranged in the same layer as the planarization layer, the pixel definition layer and the spacer layer. The second layer 2252 of the first barrier dam 225 is arranged in the same layer as any two of the planarization layer, the pixel definition layer and the spacer layer, so that the second layer 2252 of the first barrier dam 225 is higher than the first layer 2251 and the manufacturing process of the display substrate is simplified.

For example, in some embodiments, the display substrate may also include functional layers such as the barrier layer, the buffer layer and the encapsulation layer, and the specific structure and technical effects may be referred to the above embodiments, which will not be repeated here.

For example, in some embodiments, as shown in FIG. 7, the display substrate may further include a bending region 23, a plurality of traces are arranged in the bending region 23 to connect the driving circuit in the display region 21 and the peripheral region 22 to the driving chip located on the non-display side of the display substrate by bending. The specific structure and arrangement of the bending region 23 may refer to related technologies and will not be described here again.

For the display substrate provided by the embodiment of the present disclosure, the concave portion which is wholly indented is arranged at the corner edge portion of the display substrate, so that the stress exerted to the corner edge portion can be reduced in the process of bending the peripheral region, and then the problems such as wrinkles and the like at the corner edge portion after bending the peripheral region are avoided, thereby facilitating the subsequent cover plate bonding process and improving the preparation yield of the display substrate. In addition, by arranging the multi-layer isolation column and the multi-layer barrier dam at a periphery of the concave portion, the reliability of the display substrate in the concave portion can be improved, and the arrangement of the concave portion can be prevented from causing adverse effects on the display substrate, thereby improving the reliability of the display substrate.

Figure 11:
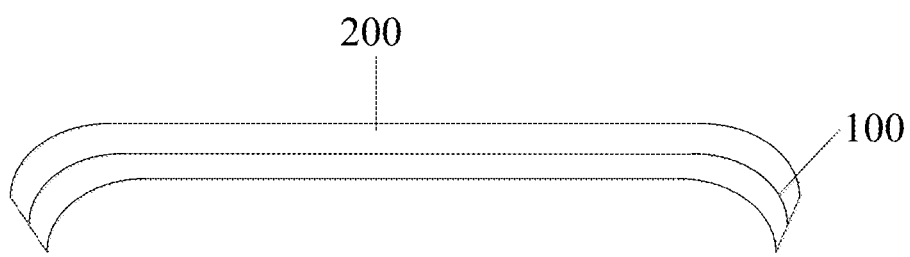
FIG. 11 is a schematic cross-sectional view of a display panel provided by at least one embodiment of the present disclosure.

At least one embodiment of the present disclosure also provides a display panel, and FIG. 11 shows a schematic cross-sectional view of the display panel. As shown in FIG. 11, the display panel includes a display substrate 100 provided by the embodiment of the present disclosure and a cover plate 200, and the cover plate 200 covers the display substrate 100 and is attached to the display region and the peripheral region.

Because in the display panel provided by the embodiment of the present disclosure, the display substrate is well attached to the cover plate, wrinkles will not occur at the corner edge position, and problems such as peeling off will not easily occur in the manufacturing process and the use process, thus improving the manufacturing yield and service life of the display substrate.

For example, the display panel provided by the embodiment of this disclosure may be used for display device, and the display device may be any products or components with display functions such as the mobile phone, the tablet computer, the television, the monitor, the notebook computer, the digital photo frame, the navigator, etc. The embodiment of this disclosure does not limit the specific form of the display apparatus.

The following statements should be noted:
(1) The accompanying drawings of the embodiment of the present disclosure involve only the structure(s) in connection with the embodiment(s) of the present disclosure, and other structure(s) may be referred to common design(s).
(2) For the purpose of clarity only, in accompanying drawings for illustrating the embodiment(s) of the present disclosure, the thickness and size of a layer or a region may be enlarged or reduced, that is, the accompanying drawings are not drawn according to the actual scale. However, it should understood that, in the case in which a component or element such as a layer, film, region, substrate or the like is referred to be "on" or "under" another component or element, it may be directly on or under the another component or element or a component or element is interposed therebetween.
(3) In case of no conflict, features in one embodiment or in different embodiments can be combined to obtain a new embodiment.

What are described above is related to the specific embodiments of the present disclosure only and not limitative to the scope of the disclosure. The protection scope of the disclosure shall be based on the protection scope of the claims.

What is claimed is:

1. A display substrate, comprising a display region and a peripheral region surrounding the display region,
the peripheral region has a first linear edge portion extending in a first direction, a second linear edge portion extending in a second direction and a corner edge portion connecting the first linear edge portion and the second linear edge portion,
wherein the first direction and the second direction intersect to each other, and a minimum distance between at least a portion of the corner edge portion and an adjacent edge of the display region is smaller than a minimum distance between the first linear edge portion and/or the second linear edge portion and an adjacent edge of the display region, so as to form a concave portion towards the display region in the corner edge portion, wherein the minimum distance between the first linear edge portion and the adjacent edge of the display region is greater than the minimum distance between the second linear edge portion and the adjacent edge of the display region.

2. The display substrate according to claim 1, wherein the display substrate has a display side and a non-display side, the first linear edge portion and the second linear edge portion are provided to be bendable towards a direction of the non-display side.

3. The display substrate according to claim 1, wherein the corner edge portion comprises an arc edge portion.

4. The display substrate according to claim 3, wherein the concave portion comprises at least one groove at a position of the corner edge portion which is adjacent to the first linear edge portion and/or the second linear edge portion.

5. The display substrate according to claim 4, wherein the display substrate has a display side and a non-display side, the corner edge portion is provided to be bendable towards a direction of the non-display side.

6. The display substrate according to claim 4, wherein the minimum distance between the first linear edge portion and/or the second linear edge portion and the adjacent edge of the display region is 0.8 mm-1.5 mm;

at the at least one groove, the minimum distance between the corner edge portion and the adjacent edge of the display region is 0.4 mm-0.6 mm.

7. The display substrate according to claim 4, wherein a shape of the at least one groove comprises a rectangle, a trapezoid or a triangle.

8. The display substrate according to claim 4, wherein the peripheral region comprises a scanning driving circuit, and the scanning driving circuit comprises a first portion and a second portion, the first portion is provided in the first linear edge portion, and the second portion is provided in the corner edge portion.

9. The display substrate according to claim 4, wherein the peripheral region further comprises a first barrier dam surrounding the display region, and the first barrier dam is conformal with the at least one groove at a position of the at least one groove.

10. The display substrate according to claim 9, wherein the peripheral region further comprises a first isolation column surrounding the at least one groove, and the first isolation column is provided at a side of the first barrier dam close to the display region.

11. The display substrate according to claim 10, wherein the peripheral region further comprises a second isolation column surrounding the at least one groove, and the second isolation column is provided at a side of the first barrier dam away from the display region.

12. The display substrate according to claim 1, wherein the concave portion comprises an indented region, and the indented region is formed by concaving an entirety of the corner edge portion towards a direction of the display region.

13. The display substrate according to claim 12, wherein the minimum distance between the first linear edge portion and/or the second linear edge portion and the adjacent edge of the display region is 0.8 mm-1.5 mm;

a minimum distance between the entirety of the corner edge portion and the adjacent edge of the display region is 0.4 mm-0.6 mm.

14. The display substrate according to claim 12, wherein the peripheral region comprises a scanning driving circuit, and the scanning driving circuit comprises a first portion and a second portion, the first portion is provided in the first linear edge portion, and the second portion is provided in the second linear edge portion.

15. The display substrate according to claim 8, wherein the first portion and the second portion are in signal connection with each other.

16. The display substrate according to claim 12, wherein the peripheral region further comprises a first barrier dam surrounding the display region, and the first barrier dam is conformal with an edge of the indented region.

17. The display substrate according to claim 16, wherein the peripheral region further comprises a first isolation column surrounding an edge of the indented region, and the first isolation column is provided at a side of the first barrier dam close to the display region.

18. The display substrate according to claim 17, wherein the peripheral region further comprises a second isolation column surrounding the edge of the indented region, and the second isolation column is provided at a side of the first barrier dam away from the display region.

19. A display panel, comprising:

the display substrate according to claim 1; and a cover plate, wherein the cover plate covers the display substrate and is attached to the display region and the peripheral region.

* * * * *